(12) United States Patent
Dent et al.

(10) Patent No.: US 6,570,907 B1
(45) Date of Patent: May 27, 2003

(54) SIMPLIFIED FINITE IMPULSE RESPONSE (FIR) DIGITAL FILTER FOR DIRECT SEQUENCESPREAD SPECTRUM COMMUNICATION

(75) Inventors: Paul W. Dent, Pittsboro, NC (US); David Barrow, Durham, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/411,309

(22) Filed: Oct. 4, 1999

(51) Int. Cl.[7] .............................. H04B 1/06; H04B 1/18
(52) U.S. Cl. ..................... 375/130; 375/140; 375/372
(58) Field of Search .................... 375/140, 130, 375/146, 377, 371, 372, 149, 145, 229; 711/102, 200, 201, 202, 209, 211, 217, 220; 708/319, 307

(56) References Cited

U.S. PATENT DOCUMENTS

| | | | |
|---|---|---|---|
| 4,996,697 A | 2/1991 | Critchlow et al. | ........... 375/104 |
| 5,500,811 A | 3/1996 | Corry | ..................... 364/724.16 |
| 5,530,722 A | 6/1996 | Dent | .......................... 375/298 |
| 5,838,725 A | 11/1998 | Gurusami et al. | ........... 375/229 |
| 5,870,431 A | 2/1999 | Easton et al. | ................ 375/230 |
| 6,456,644 B1 * | 9/2002 | Ramberg et al. | ............. 375/130 |

* cited by examiner

*Primary Examiner*—Tesfaldet Bocure
*Assistant Examiner*—Dung X. Nguyen
(74) *Attorney, Agent, or Firm*—Coats & Bennett, P.L.L.C.

(57) ABSTRACT

A spread spectrum modulated signal generator is disclosed that reduces the storage requirement for storing values representing filter responses of input signal samples in a digital filter by taking advantage of time-reversal symmetry of the responses. Moreover, the disclosed signal generator supports up-ramping and down-ramping for smooth transmission of spread spectrum modulated signals.

19 Claims, 13 Drawing Sheets

SIMPLIFIED FINITE IMPULSE RESPONSE (FIR) DIGITAL FILTER FOR DIRECT SEQUENCESPREAD SPECTRUM COMMUNICATION

FIELD OF INVENTION

This invention generally relates to the field of communication systems and more particularly to a digital filter that is used for generating a direct sequence spread spectrum modulation signal.

BACKGROUND

Digital wireless communication systems that support voice and data services are becoming widely used throughout the world. For example, in the U.S., the Telecommunication Industry Association (TIA) has published an Interim Standard known as IS-95 that specifies a cellular spread spectrum communication system.

Spread spectrum communication systems are gaining acceptance among cellular system operators, mainly because they provide spectral efficiency and frequency planning simplicity by sharing the time and frequency domains for all users simultaneously. The cellular spread spectrum communication system specified by the IS-95 standard uses a code division multiple access (CDMA) method for communicating voice and data over wideband radio frequency (RF) channels. In Japan, a similar spread spectrum system is specified under the Japanese Standard JSTD-008. Another digital communication standard, which is specified by the European Telecommunication Standard Institute (ETSI), GSM is known as Global Standard for Mobile Communication (GSM). However, GSM uses a time division multiple access (TDMA) method, as opposed to the CDMA method, to communicate voice and data over relatively narrowband RF channels.

Typically, cellular spread spectrum systems use a so-called "direct sequence" spread spectrum (DS-SS) modulation method that allows for simultaneous transmission of distinct information signals to separate users over a common wideband RF channel. According to one DS-SS modulation method, information signals having a specified bit rate are directly modulated by corresponding spreading codes or sequences to produce quadrature modulation signals for simultaneous transmission in accordance with a specified air interface. The spreading code for each information signal includes a sequence of "chips" occurring at a specified chip rate. For example, IS-95 specifies a 1.2288 Mbits/second which is much higher than the bit rate of the information signal being transmitted. The simultaneously transmitted information signals are distinguished from each other by a unique spreading sequence known as Pseudo-random (PN) sequence. In order to recover a particular transmitted information signal from among other information signals transmitted simultaneously, a DS-CDMA receiver, for example, one at a user's mobile station, multiplies the received signal by a locally generated unique user assigned PN sequence and integrates the result. In so doing, the user identifies the information signal intended for it, as distinct from the information signals intended for other users. Conventionally, the spreading sequence is sampled at a specified sampling rate and applied to a multi-tap digital FIR filter, which subjects each sample to a corresponding FIR weight coefficient, before generating a spread spectrum modulation signal.

In one related prior art, U.S. Pat. No. 5,530,722 to Dent describes an improved quadrature modulator using balanced RC filters. In one implementation, the balanced RC filters are driven by complementary and high-bit-rate sigma-delta representations of I and Q signals respectively, which are extracted from a look-up table in dependence on a succession of modulation symbols. In another implementation, where the number of successive symbols on which the sigma-delta representation depends would have resulted in a look-up table of excessive size, the disclosed filters use a number of coefficients, after which the filtered values are digitally converted to an over-sampled sigma-delta representation.

Also, U.S. Pat. No. 5,867,537 to Dent describes balanced transversal filters for generating filtered I and Q modulating waveforms that are dependent on a succession of modulation bits. Each one of the succession of bits are delayed in a register, and the delayed bit (or an inverted delayed bit) is applied to a resistive combining network according to a positive or a negative FIR weight coefficient that is associated with the delayed bit. This prior art also discloses a complementary resistor network that uses opposite bit polarities for producing balanced I and Q modulating waveforms.

In another related prior art disclosed in U.S. Pat. No. 4,644,561 to Paneth et al., (Paneth) a modem for modulating and demodulating multi-bit symbols on a radio frequency carrier uses multi-phase modulation, such as 16-phase modulation. The modulation signals are generated using a digital filter, the output of which comprises alternating In-phase (I) and Quadrature (Q) as well as −I, −Q signals. After D-to-A conversion, these alternating signals represent a modulated signal on an intermediate frequency that corresponds to ¼ of the sampling rate used at the input of the digital filter.

The digital filter disclosed in Paneth employs a read-only-memory (ROM), which stores pre-computed and partially weighted sums of symbols derived over portions of a window of L successive modulation symbols. The partially weighted sums, which are outputted by the ROM, are D-to-A converted sequentially and allowed effectively to add in a subsequent bandpass filter to form a complete weighted sum. Also, U.S. Pat. No. 4,996,697 to Critchlow et al. describes blanking the output of the D-to-A convertor waveform generator system disclosed in Paneth in order to de-glitch the D-to-A output signal, thereby preventing impurities in the transmission spectrum. However, one of the drawbacks of this arrangement is the requirement for a large size ROM for storing pre-computed weighted sums of all symbols in the window.

The IS-95 standard specifies a 48-tap FIR filter for filtering I and Q signals, prior to quadrature modulation. FIG. 1 illustrates one such conventional 48-tap FIR filter 10, which operates at a sampling rate of four times the chip rate. As shown, the digital filter 10 receives input signal samples that are represented by 1, 0, and −1 samples. The +1 and −1 samples correspond to chip values of Boolean "1"and Boolean "0" respectively, and 0 samples corresponds to no value of significance for transmission. In the instant specification, the + or −1 samples are collectively referred to as non-zero samples. The filter 10 includes 48 memory or delay elements 12, indicated by $Z^{-1}$, which are connected in a chain to receive the successive signal samples at four times the chip rate. This arrangement excites the filter 10 with a series of short, i.e., ¼ chip period, impulses that are applied to corresponding FIR coefficients, C1 to C48, to provide the filter outputs. These coefficients are implemented using suitable weighting networks, for example, digital multipliers 14. The filter outputs are summed, via a summer 16, to generate digital output bytes or words at four times the chip rate.

Generally, the output words are converted to corresponding analog voltage levels using a D-to-A convertor 18. The output of the D-to-A converter 18 is applied to an anti-aliasing filter 20 that removes undesired components. As shown, the impulses are separated by a number of consecutive zero samples, where every fourth sample is a non-zero sample followed by three zero samples. Consequently, during each one of the four samples occurring during a chip period, only 12 taps contribute to the filter output.

In accordance with Paneth, the filter 10 is simplified as described later in detail through four 12-tap filters having input and outputs multiplexed and de-multiplexed at four times the chip rate, instead of using a 48-tap filter. Moreover, since a twelve-tap filter driven by binary input values produces 4096 different output values, four 4096-element storage devices, for example, ROMs or RAMs, may store corresponding tables of pre-computed weight values for all combination of twelve inputs, i.e., $4 \times 2^{12}$ values, thereby replacing the four 12-tap filters.

Also, the four 4096-element storage devices may be combined into a single 16384-element storage device that is addressable by twelve address lines carrying non-zero samples. Under this arrangement, the outputs of the 16384-element ROM may be selected in a de-multiplexed fashion using a clock rate that is four-times the chip rate. In order to further reduce the ROM size, the address lines may be split into two 6-bit lines, with each 6-bit line addressing a respective one of two 256-element (4×64) ROMs. The outputs of the two 256-element ROMs may then be added to obtain the filter outputs.

It is, however, desired to reduce the complexity of the digital filter even further. Among other things, one of the advantages of a less complex digital filter is reduced power consumption, specially when such filter is incorporated in mobile units that operate on limited battery power. Therefore, there exists a need for a simplified digital filter, particularly, a simplified FIR filter used for generating direct sequence spread spectrum modulation signals.

SUMMARY

Briefly, according to one aspect of the present invention, a digital filter that generates spread-spectrum signals reduces complexity by taking advantage of time-reversal symmetry of the impulses derived at every predefined number of non-zero samples, thereby reducing the size of a storage device that stores pre-computed values in half The spread spectrum modulated signals are generated by receiving a number of input samples representing a digital signal as successive bits at a specified rate, wherein the modulation signals are generated at an output sample rate of more than one sample per symbol period. The successive bits are grouped into a first sub-group of bits and a second sub-group of bits that are alternately applied to a first set of address lines of a storage device. The storage device, which stores pre-computed values that correspond to input-sample filter responses, for example, FIR filter responses, is addressable by the combination of the first set of address lines and a second set of different address lines. The time-reversal symmetry according to this method of the invention is exploited by modifying the bit pattern applied to the second set of address lines, depending on whether the first sub-group of bits or the second sub-group of bits are applied to the first set of address lines. The bit pattern of the second set of address lines corresponds to the more than one sample per symbol period. According to one exemplary embodiment, a 256-element ROM or (RAM) is used with multiplexing at 8 times the chip rate to implement the filter of the invention. According to another embodiment, I and Q multiplexing is used at 16 times the chip rate to implement a quadrature digital filter using a single 256-element ROM (or RAM), which is accessed at 16 times the chip rate.

According to another aspect of the invention, means are provided for smoothly starting and terminating transmission of modulated signals by providing a ternary input signal. Transmission commences with a ternary input register initialized to contain zero value elements. Then, successive non-zero chip values are clocked in, while a filtered output is transmitted. In order to terminate transmission after the last non-zero chip value has been clocked in, the last chip is followed by clocking in a succession of zero values, while the filter output continues to be transmitted. When the ternary input register set contains only zero values in all its elements, the transmission may be terminated. The increase in the address space for the storage device that stores a look-up table when ternary digits are used is compensated in one of a variety of disclosed methods. A first method uses binary logic to reduce the address space by taking into account those combinations of digits that do not arise in the application. A second method comprises excising memory locations corresponding to addresses that do not arise in the application.

DETAILED DESCRIPTION

Figure 1:
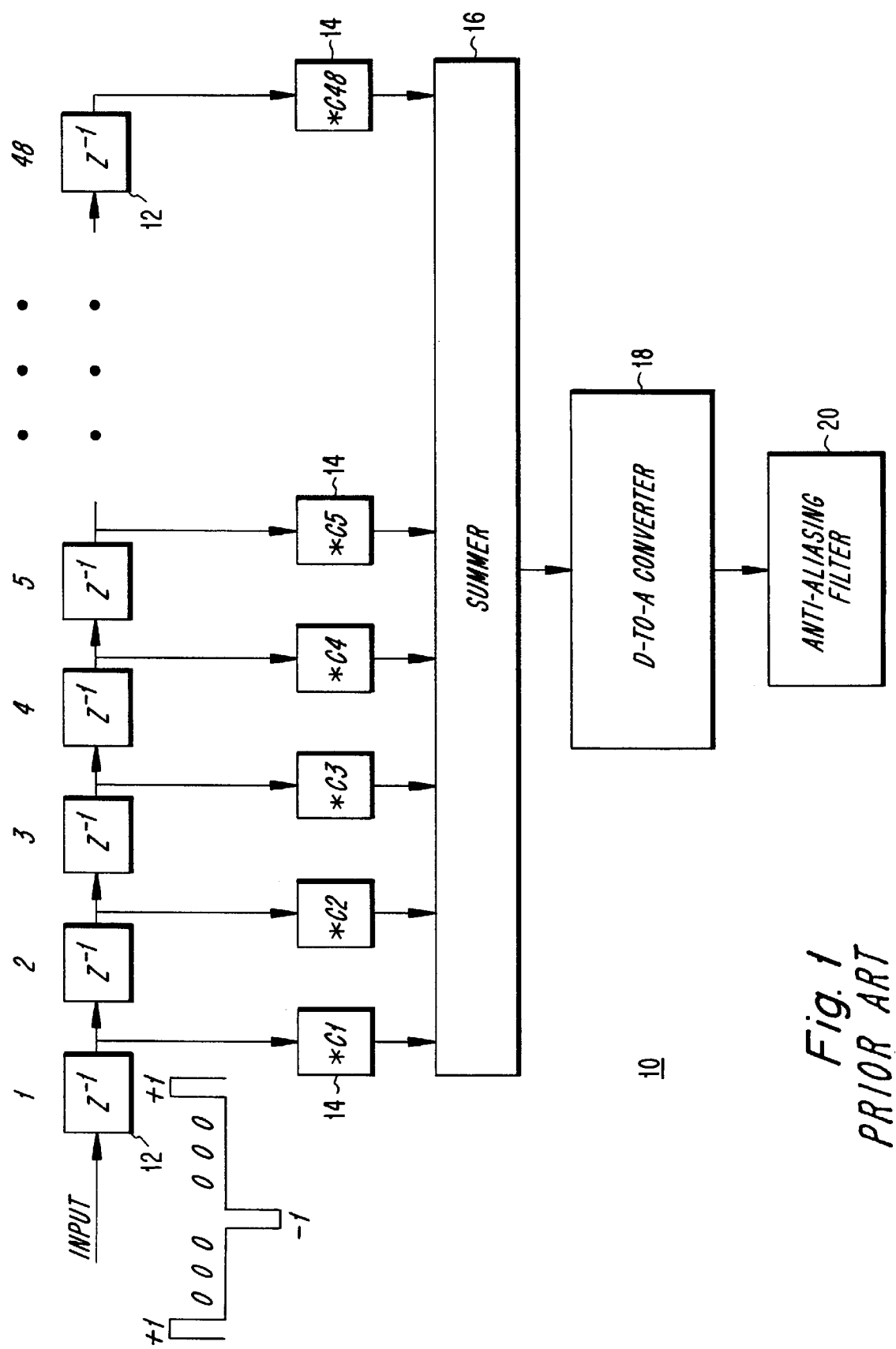
FIG. 1 shows a block diagram of a conventional 48-tap FIR filter.

As stated above, the conventional 48-tap FIR filter of FIG. 1 is driven with impulses of non-zero samples. Because samples are input at four times the chip rate, each non-zero sample of notional value +1 or −1 is followed by three zero samples, until the next non-zero sample is input. This arrangement excites the filter with a series of ¼ chip period impulses between which the samples are zero. Thus, the impulse is represented at 4 times the chip rate by a non-zero sample (+/−1) followed by three zero samples. Referring back to FIG. 1, it would be appreciated that at a first sampling phase, only the non-zero samples in taps 1, 5, 9, 13, . . . 45 contribute to the filter output. This is followed by the non-zero samples at taps 2, 6, 10, 14, . . . 46 at a second sampling phase, followed the non-zero samples by taps 3, 7, 11, 15, . . . 47 at a third sampling phase, and finally followed by the non-zero samples at taps 4, 8, 12, . . . 48 at a fourth sampling phase.

Figure 2:
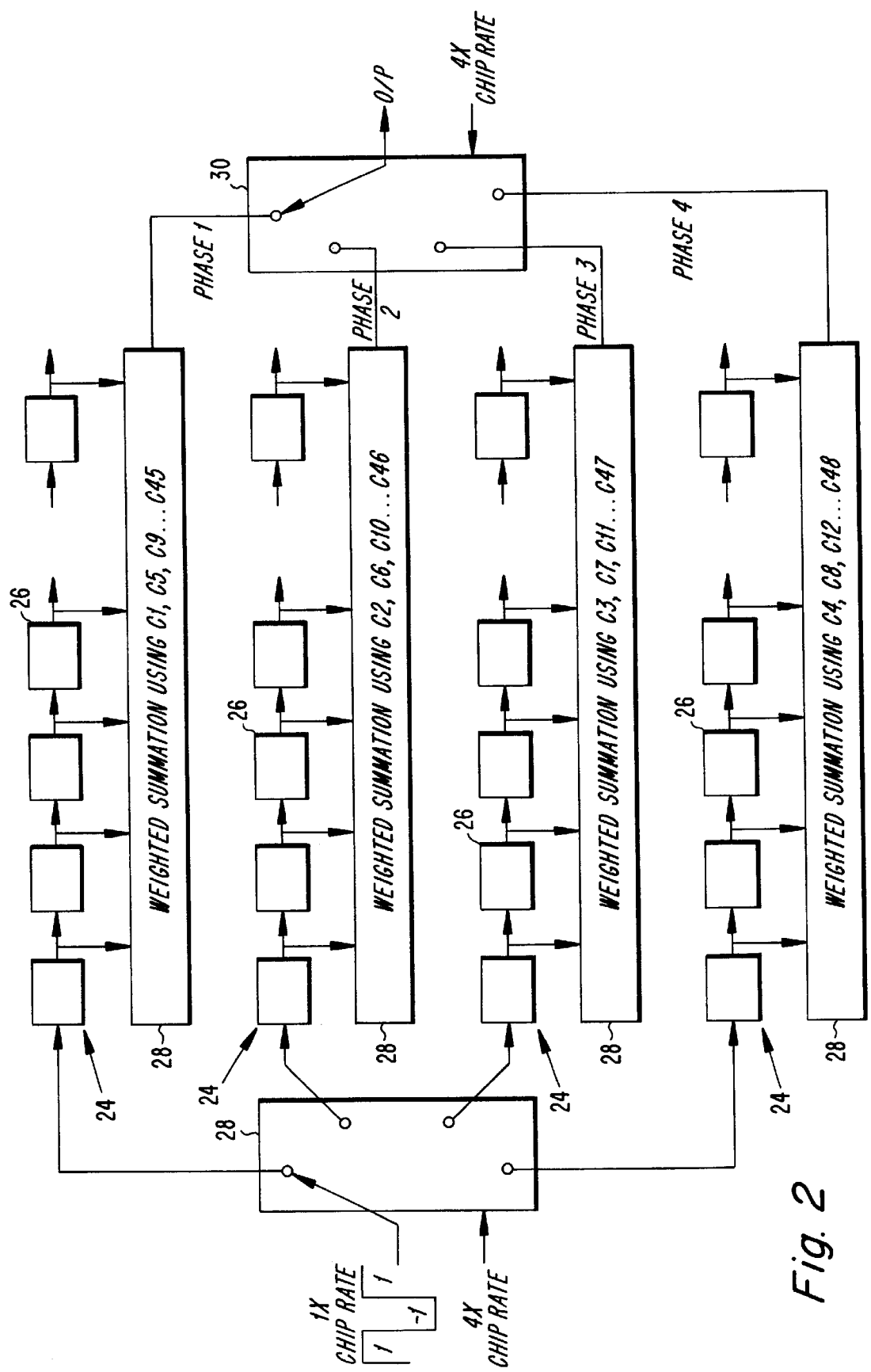
FIG. 2 shows a block diagram of a digital filter that is simplified by separating the 48-tap FIR filter of FIG. 1 into four multiplexed 12-tap filters.

Referring to FIG. 2, a first simplified filter 22 effectively separates the 48-tap filter 10 of FIG. 1 into four 12-tap filters 24. As such, the 48-tap filter of FIG. 1 is replaced by the four 12-tap filters 24 each operating at the chip rate. Each filter 24 includes a 12-bit register 16 and a summation device 28. Since only 12 of the 48 taps contain non-zero samples at any one sampling phase, the summation devices 28 only add 12 values, instead of 48 as done by the summer 16 of FIG. 1. Thus, according to this simplification, the 12 non-zero values are weighted by coefficients C1, C5, C9, . . . C45 and added to generate the first output value produced during the corresponding first sampling phase of the chip period. The coefficients C2, C6, C10, . . . C46 are used to produce the second output value, the coefficients C3, C7, C11, . . . C47 are used to produce the third output value, and the coefficients C4, C8, C12, . . . C48 are used to produce the fourth output value per chip period.

Figure 3:
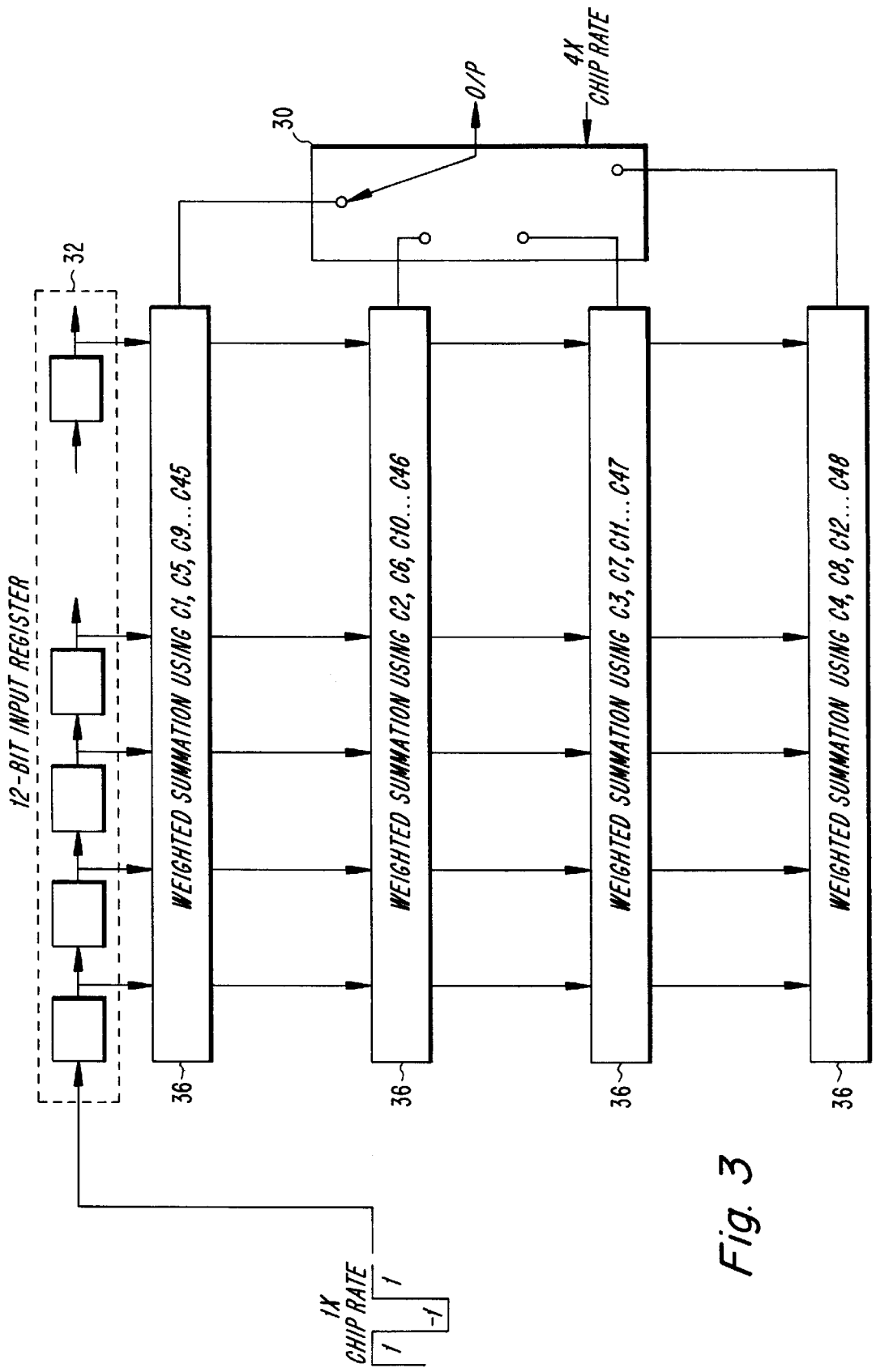
FIG. 3 shows a block diagram of a digital filter further simplified by combining four 12-bit delay registers of each filter of FIG. 2 into one register.

More specifically, input chip values are fed through an input multiplexer 30 clocked at four times the chip rate such that each of the four filters 24 in turn receives each new chip during a corresponding sampling phase. Synchronous with the input multiplexer 30, an output multiplexer 32 is clocked, at four times the chip rate, to select successively each of the four filter outputs computed during every chip period. Referring to FIG. 3, the digital filter of FIG. 2 is further simplified by replacing the four registers 26 by a single register 32. This is because each 12- bit register 26 in FIG. 2 contains the same 12 last chip values. Thus, the single 12-bit register 32 is used to drive four 12-tap filters 36. As shown, the input multiplexer 28 of FIG. 2 is therefore eliminated. However, the output multiplexer 30 is still required.

Figure 4:
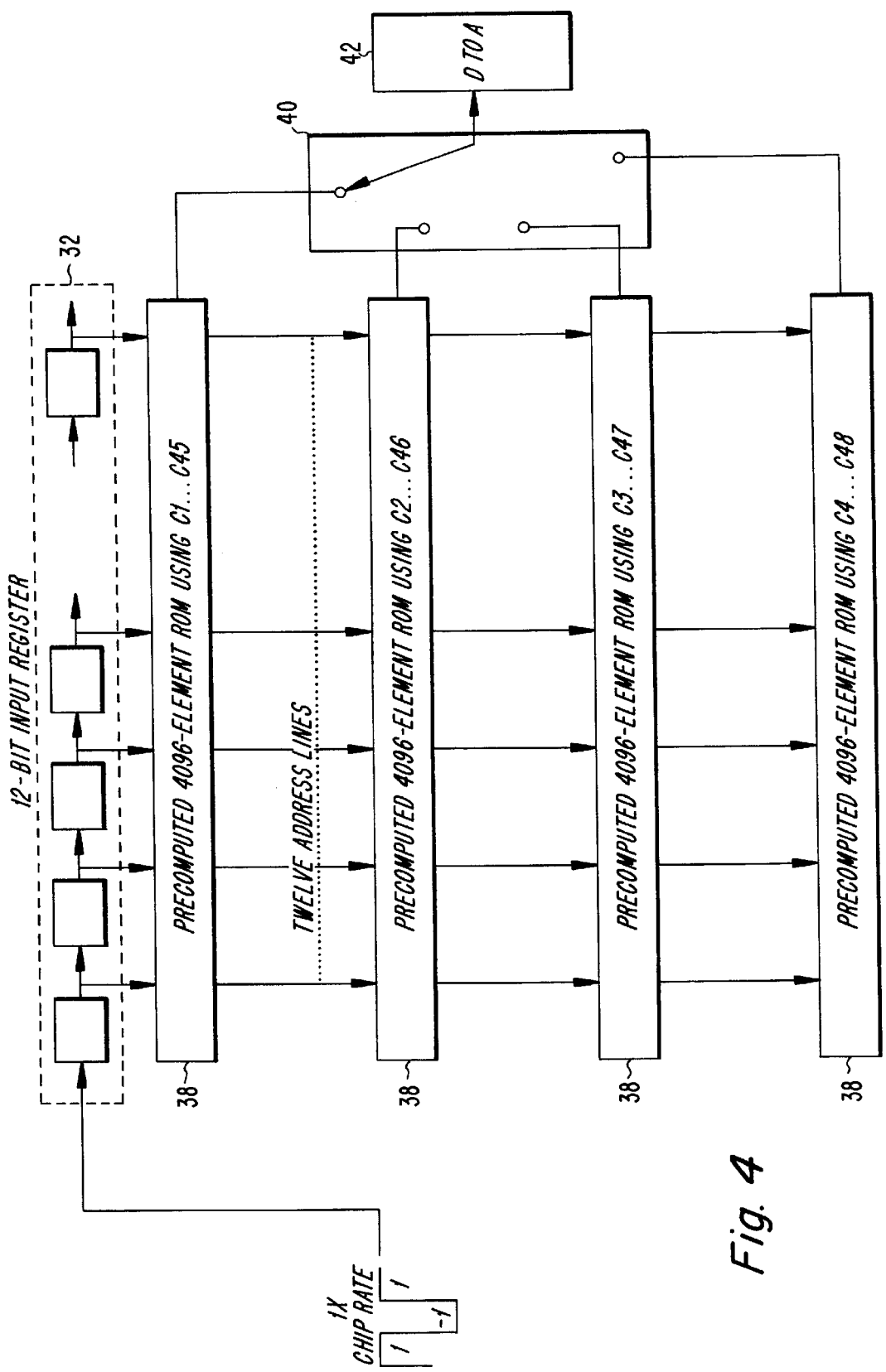
FIG. 4 shows a block diagram of a digital filter that uses four multiplexed ROMs to implement the four 12-tap filters of FIG. 2.

Each of the four filters 36 of FIG. 3 has twelve binary inputs that can assume one of two states each (+1 or −1) and thus one of $2^{12}$ or 4096 states jointly. Thus, the weighting and summation function of each filter 36 may be replaced by a pre-computed table which is addressed by the twelve last input bits of register 32. Referring to FIG. 4, the output values for all of the possible 4096 input states are pre-computed and stored in corresponding four ROMs 38. An output multiplexer 40 operated at four times the chip rate successively selects an output value from a selected location of each of the four ROMs 38 in turn. A D-to-A converter 42 converts the digital outputs of the ROMs 38 into a corresponding analog signal.

Figure 5:
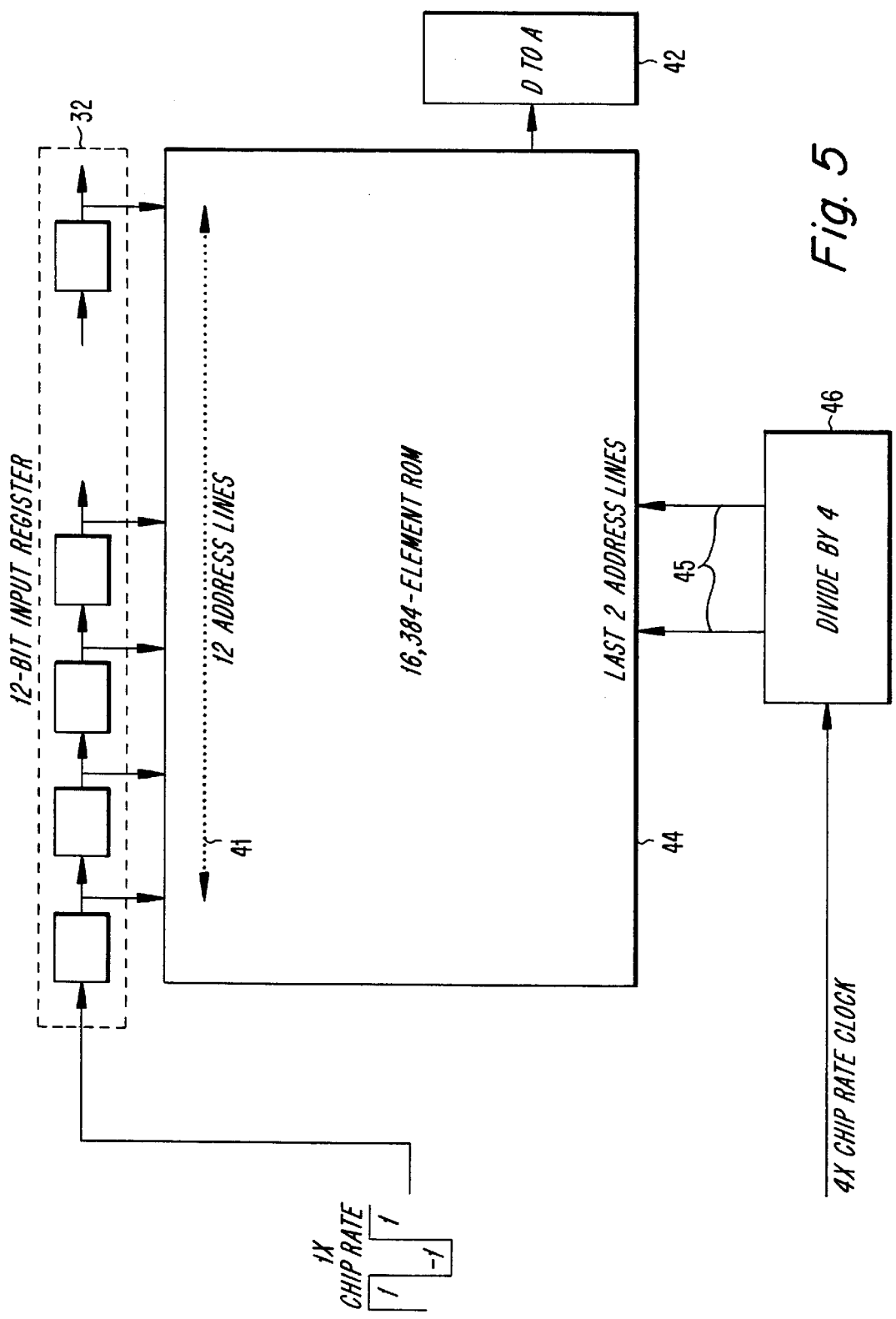
FIG. 5 shows a block diagram of a digital filter further simplified by replacing the four multiplexed ROMS of FIG. 4 with a single 4-way 16384-element ROM.

Referring to FIG. 5, the four 4096-element ROMs 38 of FIG. 4 are replaced by a four-way 16,384-element ROM 44, which is addressable by a first set of 12-bit address lines 41. Under this arrangement, the output multiplexer 40 of FIG. 4 is replaced by clocking a divide-by-4 circuit 46 at 4x chip rate to provide a second set of two-bit address lines 45. Consequently, the two output bits of the divide-by-4 circuit 46 successively assume bit patterns 00, 01, 10, 11, with such bit patterns being used as the last two address lines to select which 4096-element section of the ROM 44 produces an output value. A similar ROM arrangement, which depends only on three successive bit values, has been adapted for generating GMSK modulated signals used in the European GSM cellular system and incorporated, offered for sale and sold in GSM cellular phones manufactured by L.M. Ericsson, a Swedish company, since 1991.

Figure 6:
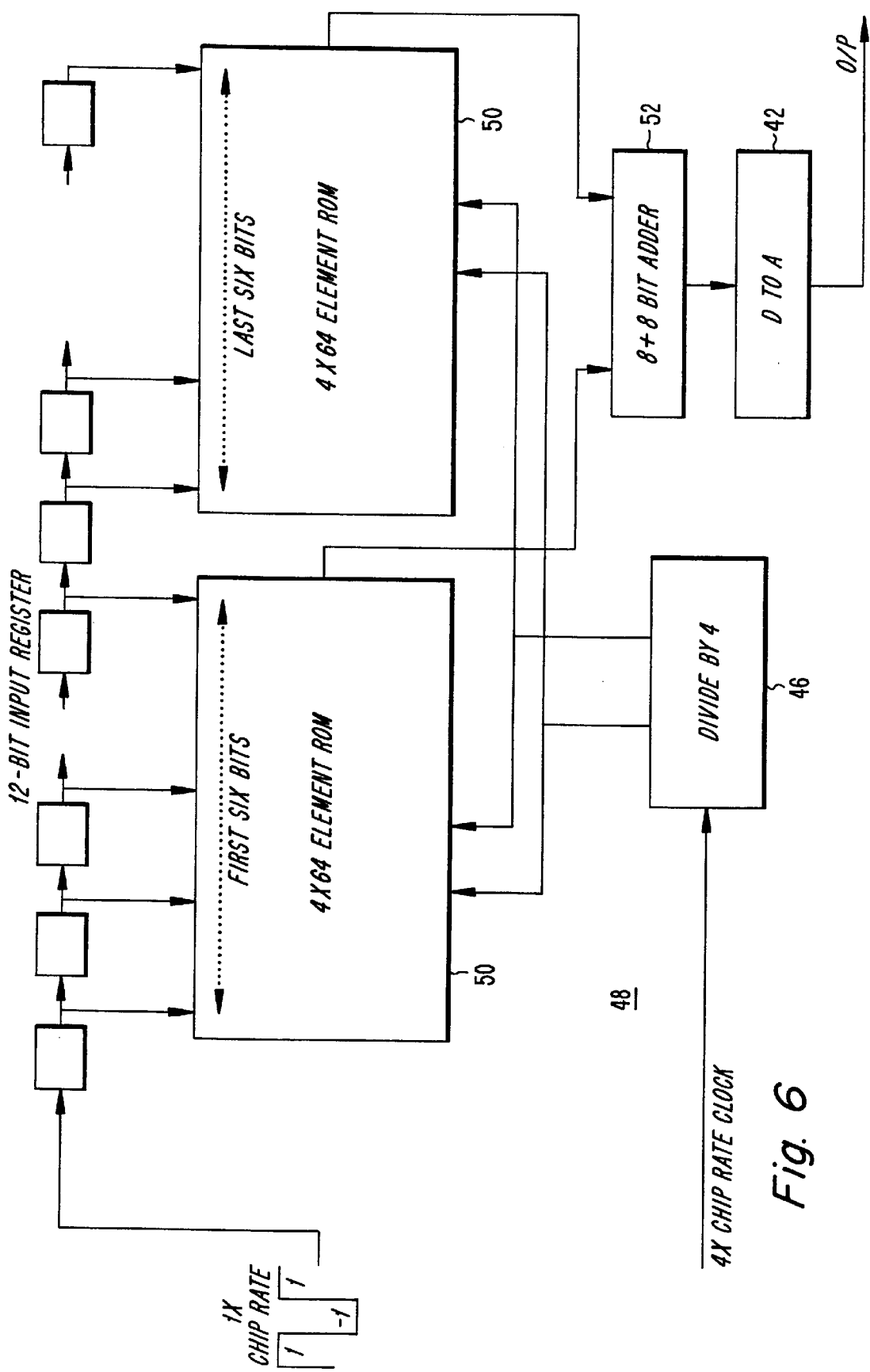
FIG. 6 shows a block diagram of a digital filter further simplified by using two 256-element ROMs instead of the four multiplexed ROMs of FIG. 4.

Referring to FIG. 6, a filter 48 divides the 12 input bits into two sub-groups of six bits to further reduce the size of the required storage device. For example, a first sub-group of six bits may correspond to the Most Significant Bits (MSB) and a last sub-group of 6 bits corresponding to the Least Significant Bits (LSB). Each sub-group of six bits addresses one of four sub-groups of $2^6$ or 64 locations, which store the sum of six weighted, bit values. It is important to note that in FIG. 6, the order of bit sub-grouping is not significant, because the values stored in the ROMs could be tailored to correspond to the particular way the input bits are split into sub-groups of bits. In this way, the four 4096-element ROMs 38 in the filter of FIG. 4 are replaced with two 256-element (i.e., 4×64 element) ROMs 50. The values provided at the outputs of the two ROMs 50 are added in parallel via an 8-bit-plus-8-bit adder 52 at four times the chip rate. Thus, in FIG. 6, the first six MSB taps and the last six LSB taps are pre-summed and the outputs of the ROMs 50 are added via the adder 52 to get a 12-tap sum.

Figure 7:
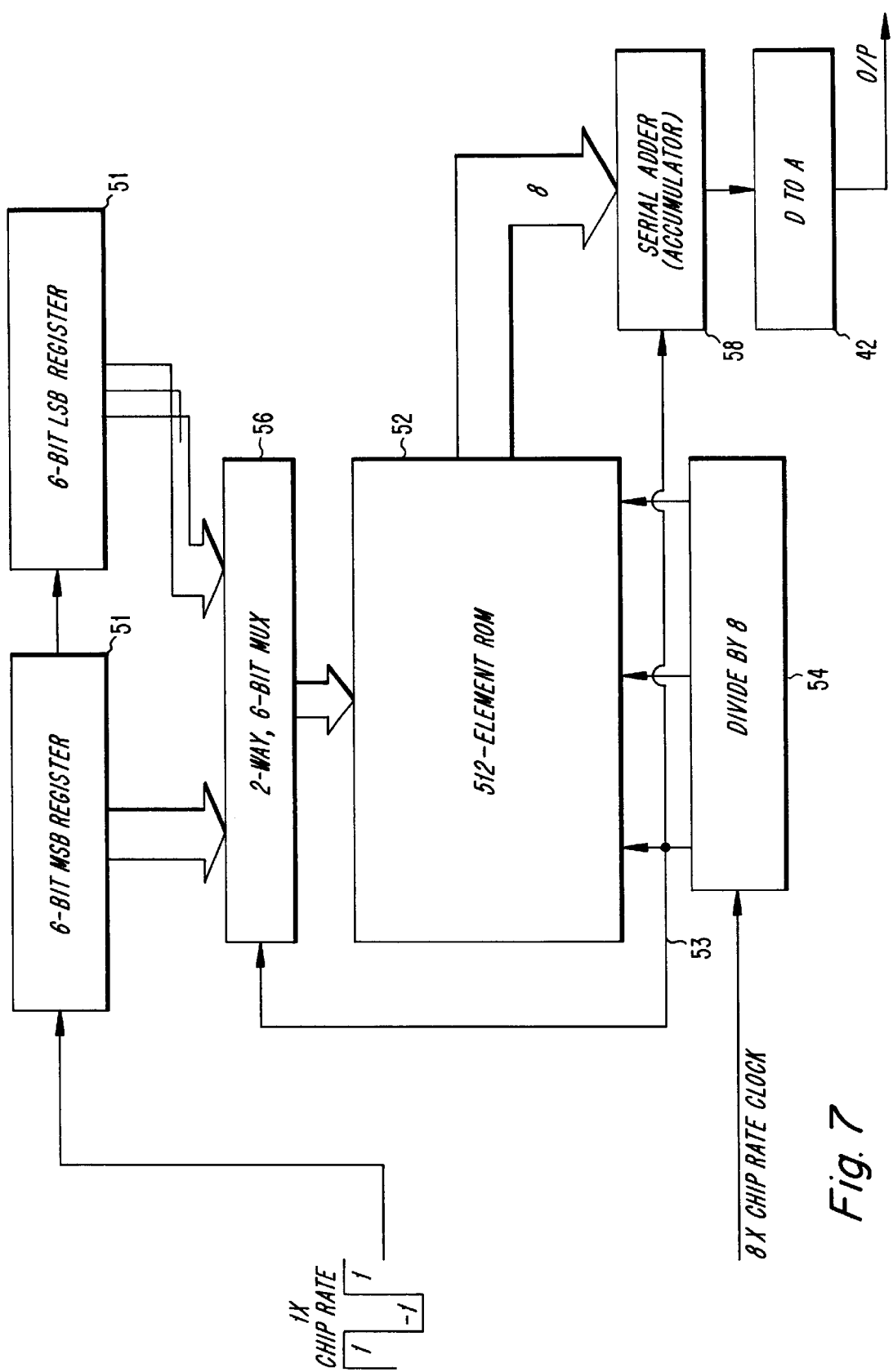
FIG. 7 shows a block diagram of a digital filter that through multiplexing uses one 512-element instead of the two 256-element ROMs of FIG. 6.

Referring to FIG. 7, another embodiment of the filter 48 combines the two 256-element ROMs 50 of FIG. 6 into a single 512-element ROM 52, which is accessible by the combination of a first set and second set of address lines. Instead of the parallel reads of FIG. 6, the memory outputs addressed by the sub-group of MSB bits and LSB bits, which are stored in corresponding 6-bit MSB and LSB registers 51, are obtained in two successive read operations via multiplexing. The MSB and LSB bits are alternately applied to the first set of address lines of the ROM 52. Under this arrangement, two reads per quarter bit period are required for making 8 reads per chip period. This is accomplished by a divide-by-8 counter 54, which provides the second set of address lines consisting of three extra address bits for addressing the ROM 52 at 8-times the chip rate. As shown by the dotted connection, the fastest-changing address bit on line 53 is used to select the 6-bit output of a multiplexer 56. The 6-bit output of the multiplexer 56 are alternately applied to the first set of address lines of the ROM 52. A serial adder 58 clocked by the line 53 accumulates the results and provides them to the D-to-A converter 42. It should be noted that in FIG. 7, the two-bit pattern applied to the second set of address lines (i.e. excluding the MSB/LSB selection bit) is the same whether MSB or LSB sub-group of bits address the ROM 52.

Often, the coefficients of an FIR filter exhibit time-reversal symmetry. In accordance with one aspect of the present invention, the size of the storage device for storing pre-computed weighted sums is reduced in half by taking advantage of time-reversal symmetry of the FIR responses. Because of the time-reversal symmetry, the impulse responses and therefore corresponding stored values for the first sampling phase addressed by the first sub-group of bits in FIG. 7 are the same as for the fourth sampling phase addressed by the second sub-group of bits. Similarly, the stored values for the second sampling phase addressed by the first sub-group of bits are the same as the third sampling phase addressed by the second sub-group of bits. Therefore, in FIG. 7, the outputs of the ROM 52, when the MSB bits are applied for a sampling phase "i" are the same as that when the LSB bits are presented in reversed order for a sampling phase L–i, where the sampling phases are numbered 0, 1, 2 . . . L (e.g. L=4). In accordance with this aspect of the invention, the 512-element ROM 52 of FIG. 7 is replaced with a smaller size 256-element ROM, which stores only half of the values stored in the ROM 52 because of time-reversal symmetry of the FIR impulse responses. In addition, the addressing is modified to select sampling phase L–i instead of phase "i" to provide suitable output value during the various sampling phases.

Figure 8:
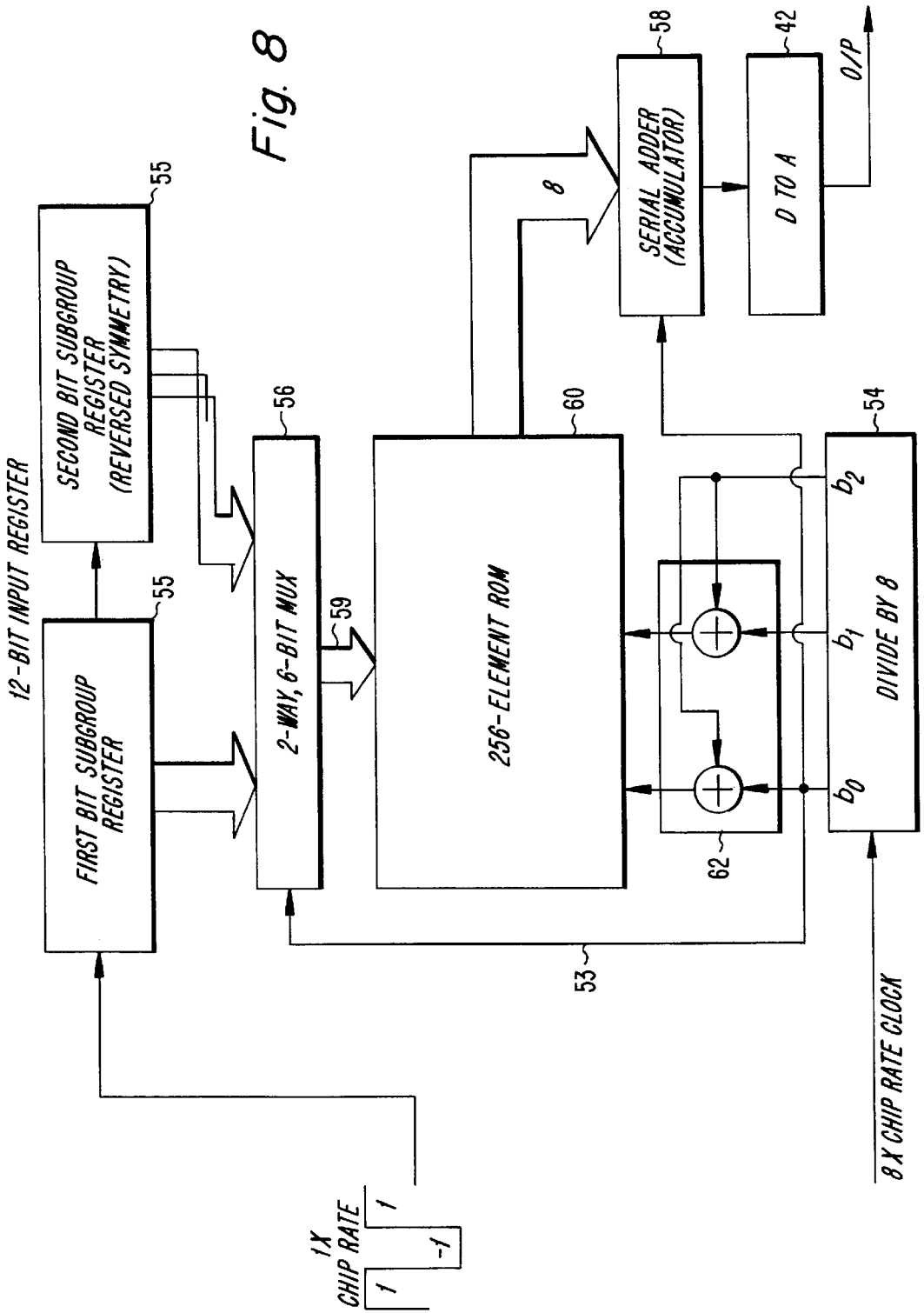
FIG. 8 shows a block diagram of a digital filter that reduces the storage device size by taking advantage of time reversal symmetry in accordance with the present invention.

Referring to FIG. 8, a digital filter in accordance with the present invention receives input samples representing a digital signal as a series of input bits having a specified rate, i.e., the chip rate of the digital signal. In accordance with the present invention, the received input bits are grouped into a first bit-sub-group and a second bit-sub-group such that time reversal symmetry of the FIR responses may be exploited. It would be appreciated that in order to take advantage of the time-reversal symmetry in accordance with this aspect of the present invention, it is not strictly necessary to group the bits into the MSB bits and LSB bits. For example, a first bit-sub-group consisting of bit 1, 3, 5, 7, 9, and 11, and a second bit-sub-group consisting of bits 12, 10, 8, 6, 4 and 2 may be applied to suitably address the content of the ROM 60. In the exemplary embodiment described, the first and second sub-group of bits correspond to MSB and LSB bits. Each sub-group of bits, which are stored in registers 55, are alternately selected by a six-bit multiplexer 56. The selected sub-group of six bits are applied to a first set of address lines 59 of a storage device 60, for example, a 256-element ROM, in strictly reversed order. Similar to the ROM 52 of FIG. 7, the ROM 60 is addressable by two sets of address lines: the first set of address lines and a second set of address lines. However, for the implementation of time-reversal symmetry, it is necessary to modify the bit pattern of the second set of address bits, which corresponds to an output sampling phase, depending on whether the first or second sub-group of bits are applied to the first set of address lines.

Therefore, an address modifier circuit 62, which in the exemplary embodiment shown is a modulo-2 add XOR circuit, modifies two address bits by complementing sampling phase bits provided by a divide-by-8 counter 54 clocked at 8 times the chip rate. The counter 54 provides output bits $b_0$, $b_1$, and $b_2$, which are applied to the address modifier circuit 62. In the embodiment shown in FIG. 8, a line 53 is XOR-ed as shown with bit $b_2$, for modifying the second set of address lines of the ROM 60. It would be appreciated that the address modifier circuit 62 shown in FIG. 8 is exemplary and other such address modifier circuits that implement a logic for exploiting the time-reversal symmetry in accordance with the present invention may be utilized.

Figure 9:
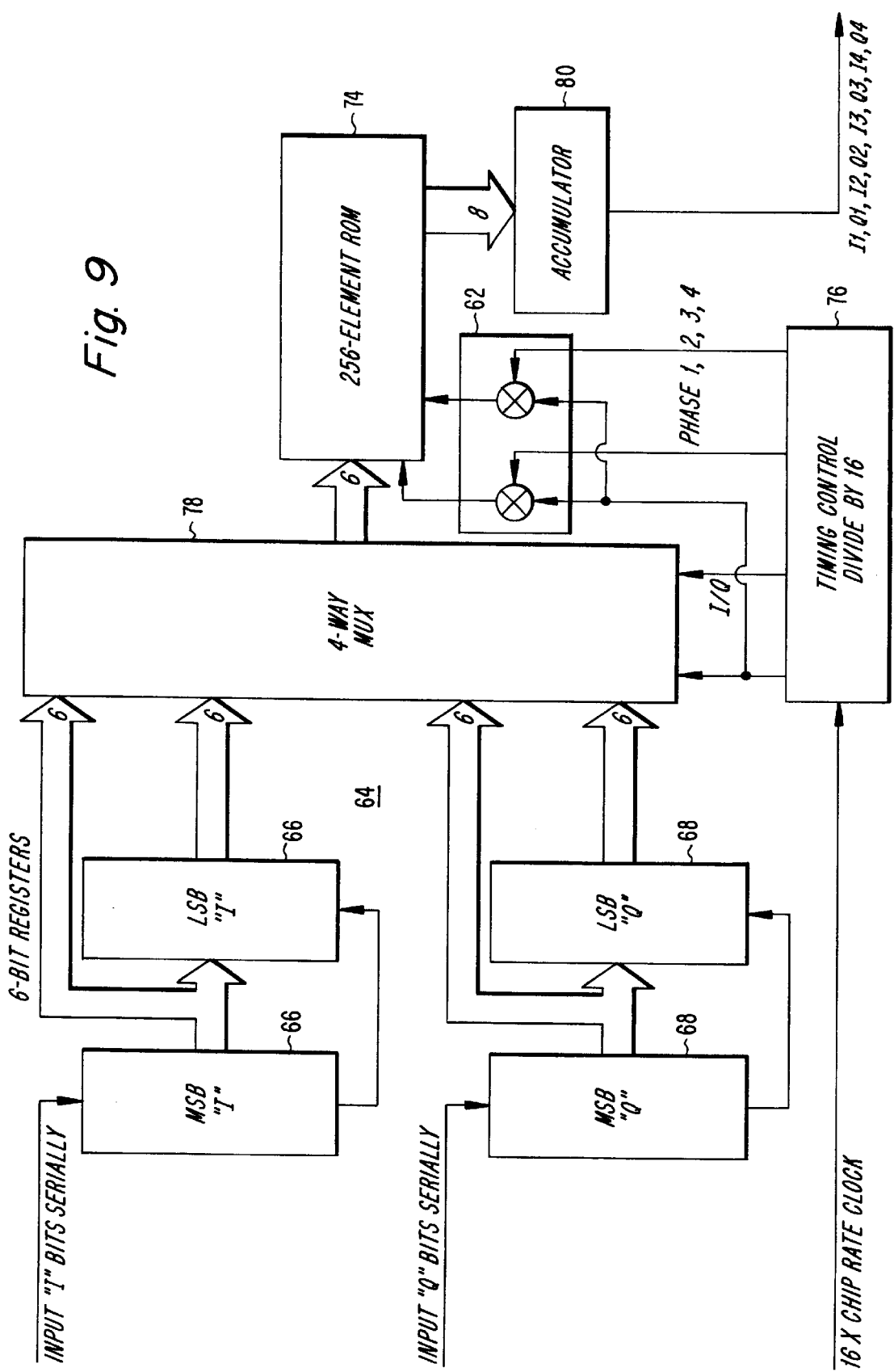
FIG. 9 shows a block diagram of a quadrature digital filter that in accordance with another embodiment of the invention multiplexes I and Q inputs.

Referring to FIG. 9, a filter 64 shows a quadrature digital filter that uses a modified version of the filter of FIG. 8 for generating quadrature spread spectrum modulated signals, in accordance with another embodiment of the present invention. Two sets of input registers, each consisting of MSB and LSB I-registers 66 and MSB and LSB Q-registers 68, receive "I" and "Q" bits serially. Under this arrangement, the 6-bit MSB and LSB registers 66 or 68, which respectively store I or Q input bits, corresponds to registers 55 of FIG. 8. The filter 64 alternately selects the I and Q bits stored in the registers 66 and 68 at 16 times the chip rate. Similar to the filter of FIG. 8, a divide-by-16 circuit 76 provides the output for selection inputs of a 4-way multiplexer 78. Therefore, the filter outputs are generated through 16 reads per chip period, i.e., double the read rate of FIG. 8, from a 256-element ROM 74. The address modifier circuit 62 provides modified address lines for reading the contents of the ROM 74, which are arranged to take advantage of the time-reversal symmetry as described in connection with FIG. 8.

According to this embodiment, the filter 64 alternately computes "I" and "Q" outputs corresponding to "I" and "Q" input bits through sixteen reads per chip period in the following order:.

1. Read a value for a sampling phase 1 corresponding to the first 6 last bits of the I chip stream,
2. Read a value for the sampling phase 1 corresponding to the last 6 last bits of the I chip stream and accumulate in an accumulator 80; output accumulated value I1.
3. Read a value for the sampling phase 1 corresponding to the first 6 last bits of the Q chip stream;
4. Read a value for the sampling phase 1 corresponding to the last 6 last bits of the Q chip stream and accumulate; output accumulated value Q1.
5. Read a value for a sampling phase 2 corresponding to the first 6 last bits of the I chip stream;
6. Read a value for the sampling phase 2 corresponding to the last 6 last bits of the I chip stream and accumulate, output accumulated value 12.
7. Read a value for the sampling phase 2 corresponding to the first 6 last bits of the Q chip stream;
8. Read a value for the sampling phase 2 corresponding to the last 6 last bits of the Q chip stream and accumulate; output accumulated value Q2.
9. Read a value for a sampling phase 3 corresponding to the first 6 last bits of the I chip stream;
10. Read a value for the sampling phase 3 corresponding to the last 6 last bits of the I chip stream and accumulate; output accumulated value I3.
11. Read a value for the sampling phase 3 corresponding to the first 6 last bits of the Q chip stream;
12. Read a value for the sampling phase 3 corresponding to the last 6 last bits of the Q chip stream and accumulate; output accumulated value Q3.
13. Read a value for a sampling phase 4 corresponding to the first 6 last bits of the I chip stream;
14. Read a value for the sampling phase 4 corresponding to the last 6 last bits of the I chip stream and accumulate; output accumulated value I4.
15. Read a value for the sampling phase 4 corresponding to the first 6 last bits of the Q chip stream;
16. Read a value for the sampling phase 4 corresponding to the last 6 last bits of the Q chip stream and accumulate; output accumulated value Q4.

Thus, the filter 64 produces successively the values I1, Q1, I2, Q2, I3, Q3, I4, Q4 which may be separated into I1, I2, I3, I4 for conversion by an "I" D-to-A convertor (not shown) and into Q1, Q2, Q3, Q4 for conversion by a "Q" D-to-A convertor (not shown). The "I" and "Q" D-to-A convertor outputs are then further smoothed to eliminate 4 times chip rate ripple and higher prior to modulating a signal using a quadrature modulator (not shown).

It would be appreciated that in the filters shown in FIGS. 8 and 9, the signal to be filtered always comprises 12 non-zero chip values. There, is however a need to consider the beginning and end of transmissions when no non-zero bit value exists prior to the first bit nor after the last bit. Under this situation, transmissions may be initiated by first loading in twelve zero values that signify a no-transmission state during an "up-ramping" phase prior to entering the first bit value of +1 or −1 for transmission. Similarly, during a "down-ramping" phase, the transmissions may be terminated by loading twelve zero values after the last non-zero chip or bit value.

Figure 10:
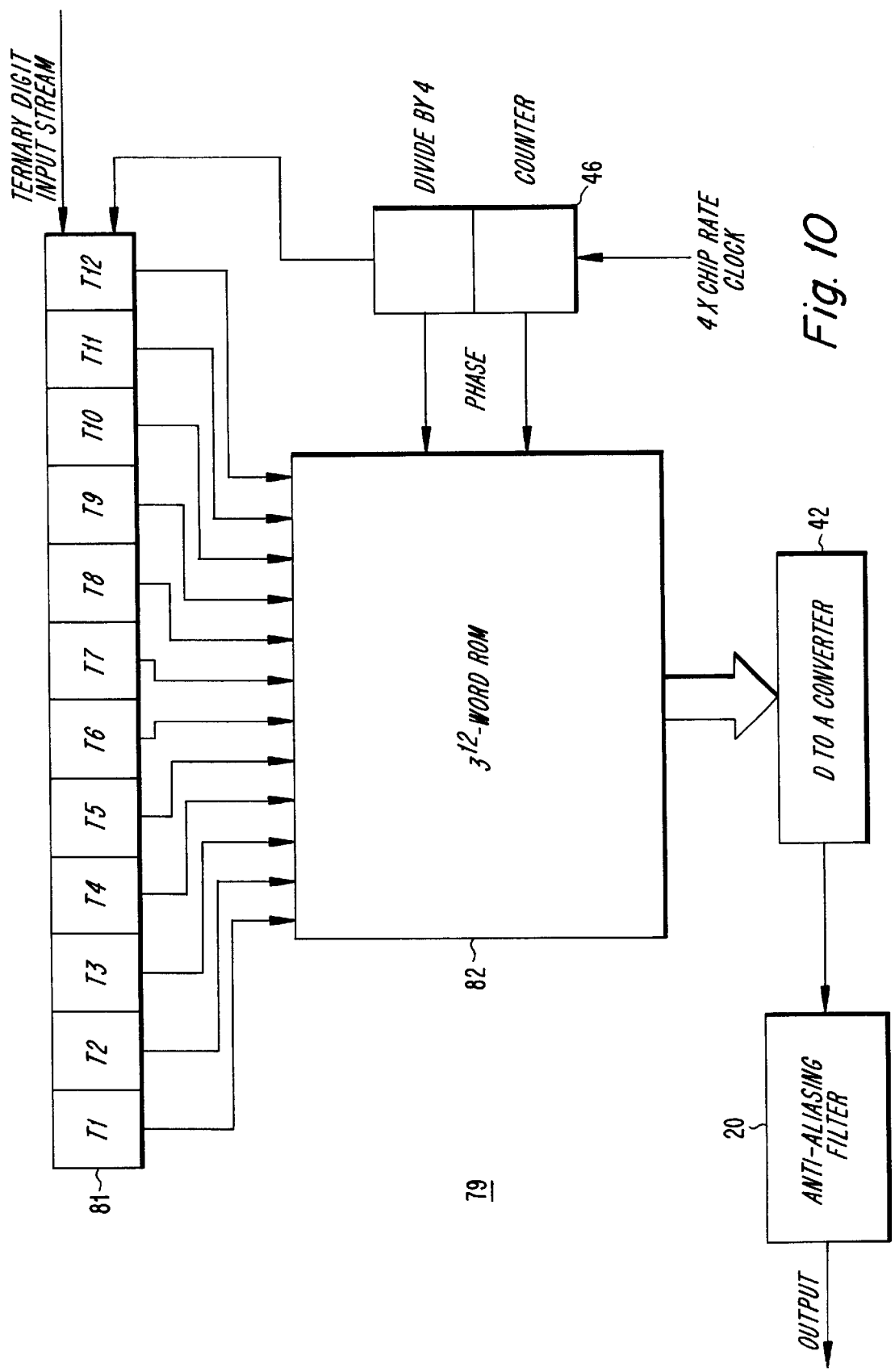
FIG. 10 shows a block diagram of a digital filter that uses ternary digits to start and terminate transmission of modulated signals.

FIG. 10 shows a block diagram of a digital filter 79 that uses ternary digits T1–T12, which are loaded in an input register 81, for implementing a filtering function using the up-ramping and down-ramping phases. Under this arrangement, the contents of the twelve bit inputs comprise ternary values having three states of +1, 0 or −1. Thus, the inputs T1–T12 can produce $3^{12}$ different states. The digital filter 79 may be implemented, without any simplification, using a storage device 82 that has $4 \times 3^{12}$ elements for storing the combinations of output values for the four sampling phases. Even splitting the ternary inputs into two groups of 6 ternary digits would create $3^6$ or 729 states, which requires a storage device that is more than 10 times the size of the storage device used for storing the 64 values of the filter of FIG. 6.

Figure 11:
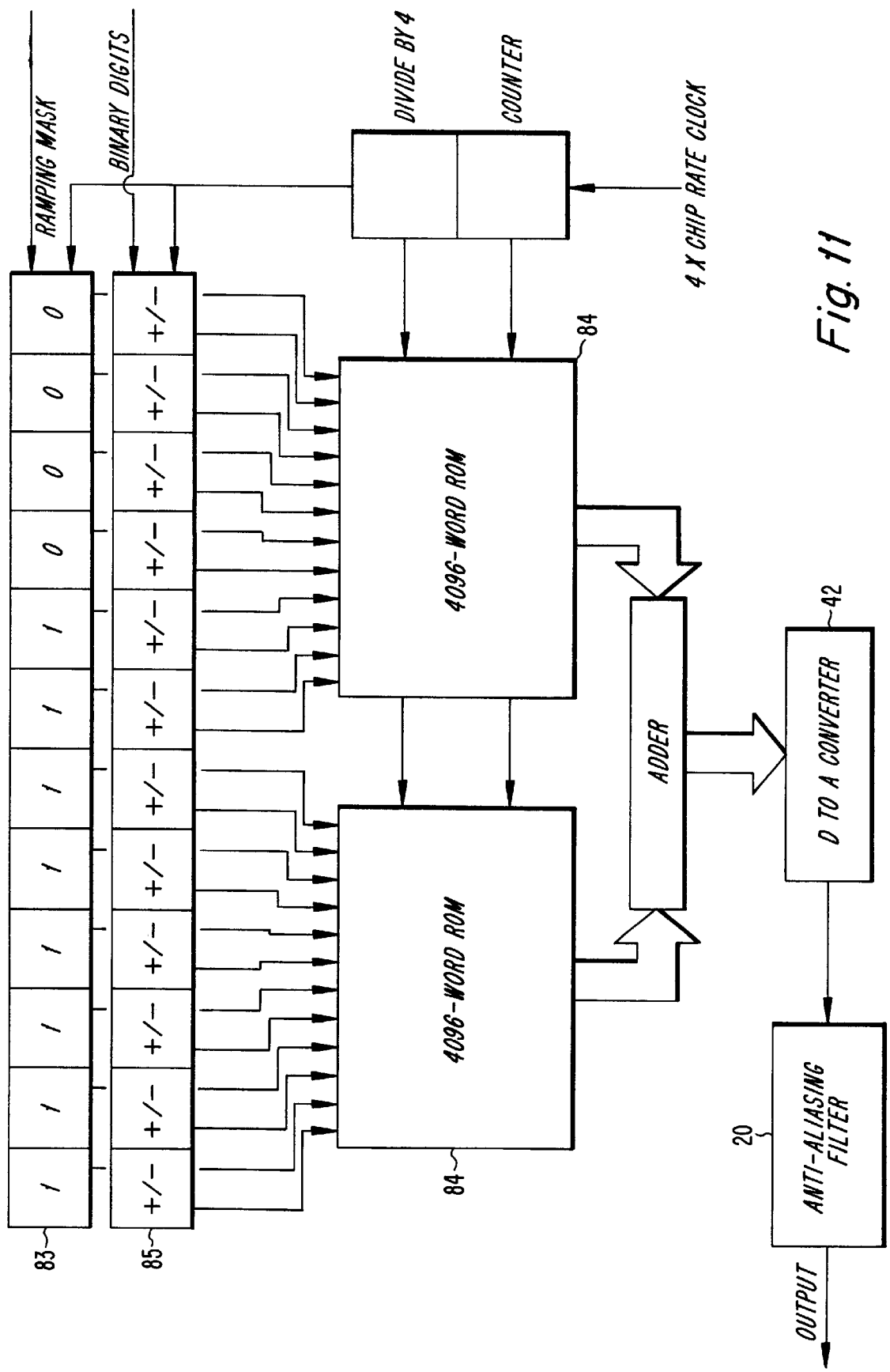
FIG. 11 shows the ternary digits of FIG. 10 represented by a magnitude bit and a sign bit.

Referring to FIG. 11 a filter 91 implements the filter of FIG. 10 by representing each of the twelve ternary values by two binary input bit series that are stored in two separate registers 83 and 85. One binary bit indicates whether an information bit is to be transmitted. For example, a binary state "1" indicates that an information bit should be transmitted and a binary bit state "0" indicates that no information is to be transmitted. Another bit indicates the sign or polarity of the information bit that is to be transmitted, i.e. +1 or −1. When two bits are used per ternary digit, the number of address lines for 6 ternary digits would be twelve, and the size of the storage devices would increase from 64 to 4096, as shown by ROMs 84 in FIG. 11.

In order to simplify a digital filter that provides for up-ramping and down-ramping of modulated signals, another aspect of the present invention takes into account that not all combinations of ternary digits are encountered during up-ramping and down-ramping phases. The combinations that should occur for addressing are shown in Table 1, below.

TABLE 1

| one | two | three | four | five | six | |
|---|---|---|---|---|---|---|
| +/−1 | +/−1 | +/−1 | +/−1 | +\−1 | +\−1 | Illustrated as a non-ramping case that may be handled by filter of FIG. 8, for example. |
| +\−1 | +\−1 | +/−1 | +/−1 | +/−1 | 0 | Start of down-ramping, which is the same state as the start of up-ramping in time-symmetric implementation. Number of states $2^5$ or 32 |
| +\−1 | +/−1 | +/−1 | +/−1 | 0 | 0 | Number of states $2^4$ or 16 |
| +/−1 | +/−1 | +/−1 | 0 | 0 | 0 | Number of states $2^3$ or 8 |
| +/−1 | +/−1 | 0 | 0 | 0 | 0 | Number of states $2^2$ or 4 |
| +/−1 | 0 | 0 | 0 | 0 | 0 | Number of states $2^1$ or 2 |
| 0 | 0 | 0 | 0 | 0 | 0 | End of down-ramping. No states required |
| 0 | 0 | 0 | 0 | 0 | +/−1 | Start of up-ramping, which is the same state as the start of down-ramping in time-symmetric implementation. Number of states $2^5$ or 32 |
| 0 | 0 | 0 | 0 | +/−1 | +/−1 | Number of states $2^4$ or 16 |
| 0 | 0 | 0 | +/−1 | +/−1 | +/−1 | Number of states $2^3$ or 8 |
| 0 | 0 | +/−1 | +/−1 | +/−1 | +/−1 | Number of states $2^4$ or 16 |

TABLE 1-continued

| one | two | three | four | five | six | |
|---|---|---|---|---|---|---|
| 0 | +/−1 | +/−1 | +/−1 | +/−1 | +/−1 | End of up-ramping. Number of states $2^1$ or 2 |

As a result, for each sampling phase, the total number of values needed for supporting up-ramping states (or down-ramping in time-symmetric implementation) is 62 (i.e., 32+16+8+4+2). Similarly, an additional 62 (i.e., 32+16+8+4+2) values are required for supporting down-ramping (or up-ramping in time-symmetric implementation). In addition to the combined 124 up-ramping and down-ramping values above, an additional value is required for the all-zeros state. Thus, the total number of memory locations for accommodating up-ramping and down ramping for the four sampling phases is equal to 125×4=500 locations. Thus, up- and down-ramping for starting and terminating transmissions can be implemented by increasing the number of table values from the 256, for example as described in connection with filters of FIG. 8 or 9, to 256+500=756 locations.

Figure 12:
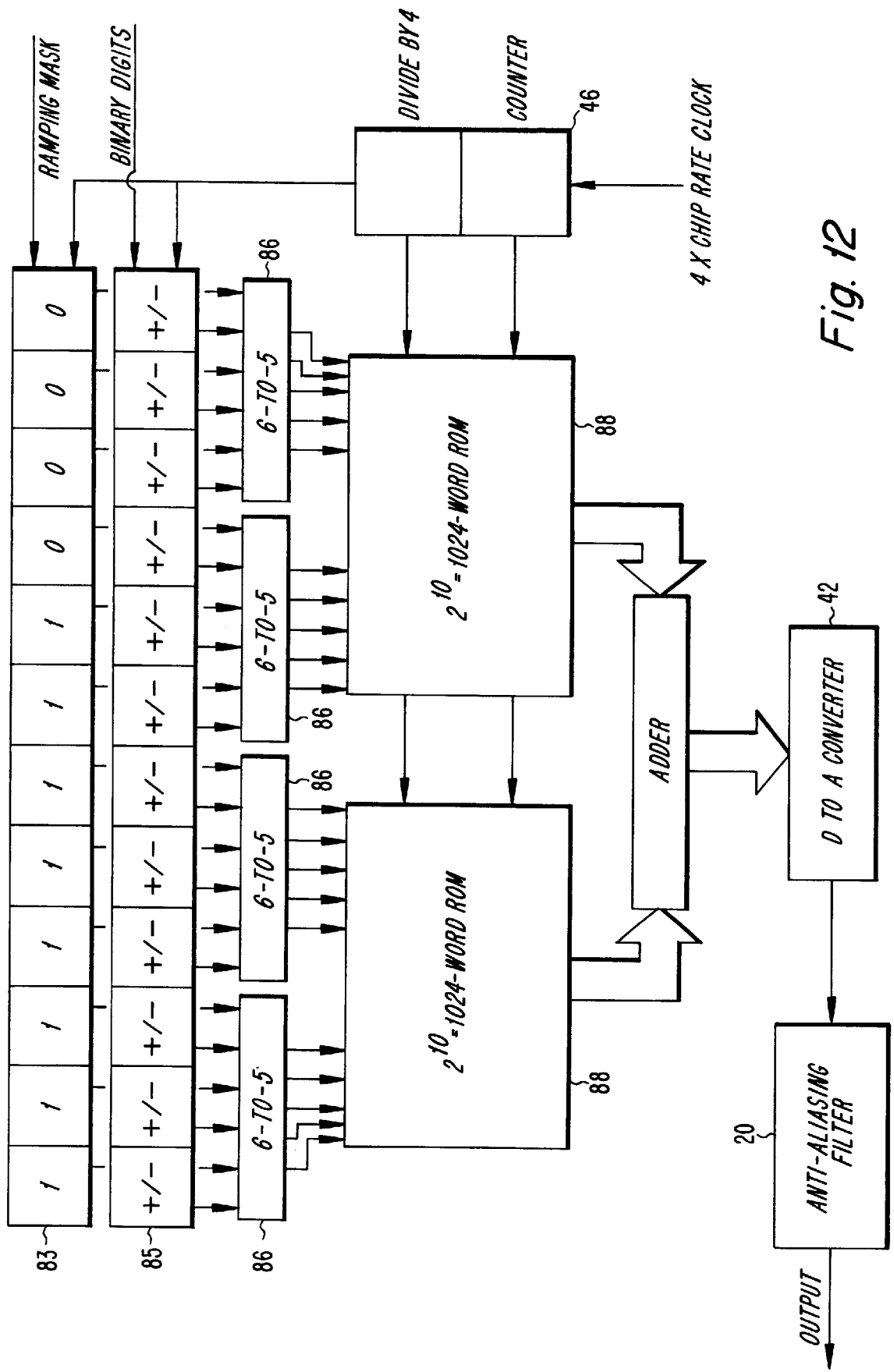
FIG. 12 shows reduction of the address space of a storage device in the digital filter of FIG. 10 using 6-to-5 line conversion logic operating on groups of three ternary digits.

Referring to FIG. 12, four 6-to-5 line reduction logic circuits 86 are used to operate on three ternary digits at a time to compress out the combinations that do not arise. The only combinations of three successive ternary digits that occur in up- and down-ramping are shown in Table 2, below:

TABLE 2

| d1 | d2 | d3 | | |
|---|---|---|---|---|
| d1 | d2 | d3 | where d(i) are non-zero binary values | 8 combinations |
| d2 | d3 | 0 | start of down-ramping | 4 combinations |
| d3 | 0 | 0 | continuation of down-ramping | 2 combinations |
| 0 | 0 | 0 | end of ramping | 1 value |
| 0 | 0 | d1 | start of up-ramping | 2 combinations |
| 0 | d1 | d2 | continuation of up-ramping | 4 combinations |
| | | | | 21 total |

The total of 21 needed values can be addressed using 5 bit lines. Therefore, a 6-to-5 line convertor detects the allowed combinations of 3 ternary digits of two bits each and maps them to unique 5-bit addresses in the range 0–20. As such, two 1024-element (i.e. $2^{10}$) ROMs 88 are respectively addressed by two 5-bit addresses, as shown in FIG. 12. In another arrangement, the ROM sizes may be further reduced based on the fact that the two 5-bit address can each only range from 0 to 20. As such, each ROM 88 may be sized as a 441-element ROM, for example, as an application specific memory, that stores $21^2=441$ values.

Figure 13:
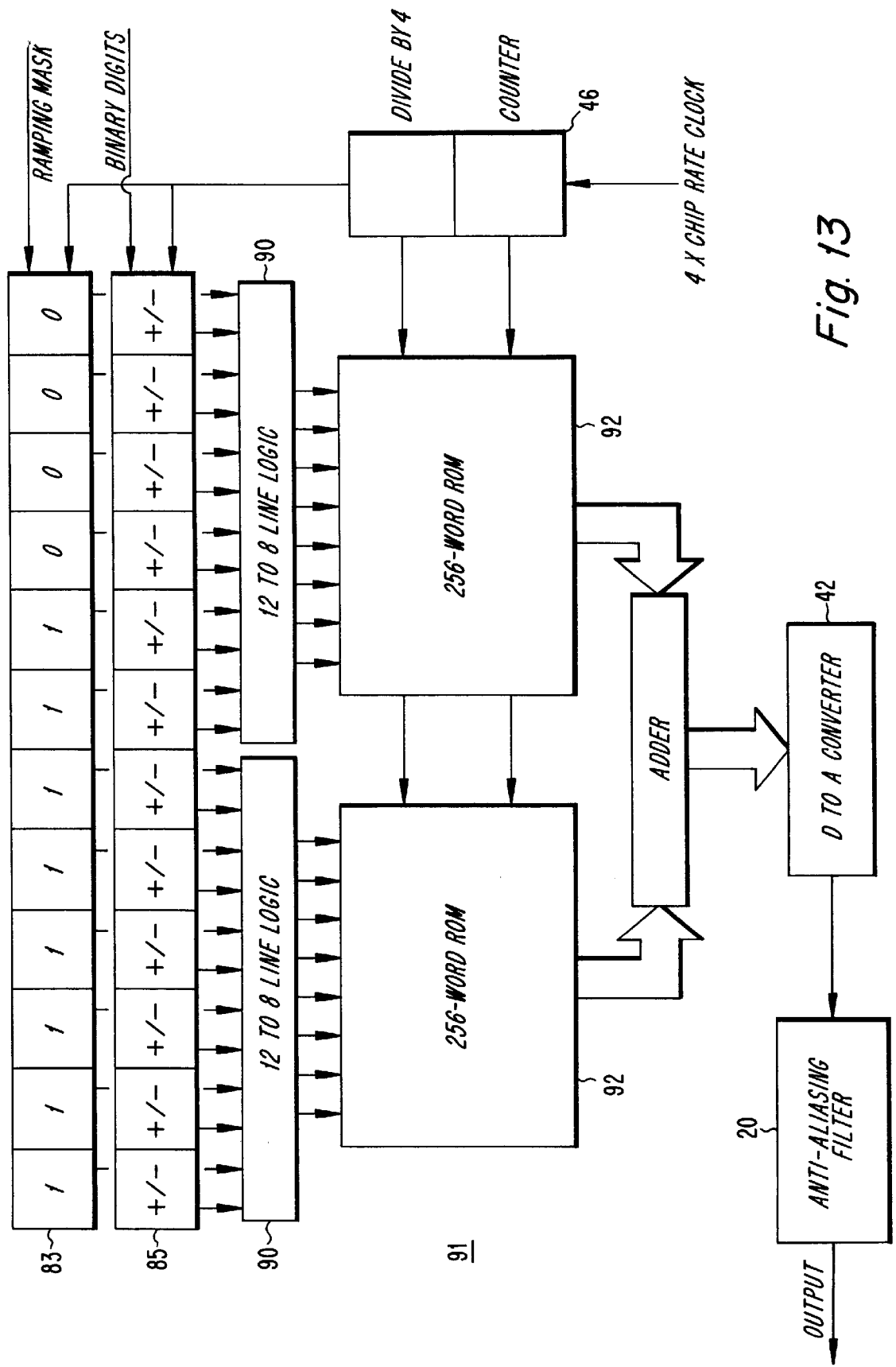
FIG. 13 shows reduction of the address space of the storage device in the digital filter of FIG. 10 using 12-to-8 line conversion logic operating on groups of six ternary digits.

FIG. 13 shows an alternative simplification using 12-to-8 line logic circuits 90 to reduce 6 ternary digit of two bits each to 8-bit addresses that define 189 allowed combinations (i.e., 125+64 or 756/4 combinations for each of the sampling phases). Two ROMs 96 are respectively addressed by 8 address lines that define up to 256 values. However, because only those locations with addresses 0 to 188 are used, the remaining locations of the ROMs 96 from 189 to 256 may be excised to save chip area. Because only 189 locations are needed during each of the four sampling phases, a single 756-element application specific storage device may also be used. Such an application specific storage device is addressed using two address lines that define one of the four sampling phases, effectively to define which of the four sets of 189 locations that store table values is accessed.

In another embodiment, the use of address space compression logic can be omitted using a ROM of notionally 4096-element size (not shown). Under this embodiment, the six two-bit lines corresponding to 6 ternary digits are provided to a 4096-element ROM, but those locations that are never addressed are excised so that 756 locations remain. Therefore, in accordance with the embodiment, the storage device, which is addressable by ternary register outputs, stores a number of values that is less than the total number of values needed for all possible combinations of the ternary register outputs. In this way, a Read Only Memory or Look-up Table of reduced size is provided with an electronic memory that is nominally capable of being configured to store a number of quantities, with such number being a power of two. The electronic memory is addressed by a number of bit lines capable of representing a number of states equal to the power of two, wherein the memory is configured by omitting storage elements corresponding to states of said address bit lines that are known not to occur in a given application.

Furthermore, due to time-reversal symmetry, the two ROMs 96 of FIG. 13 may be combined into a single ROM (not shown) that is addressed alternately with the first six ternary digits and then the second six ternary digits reversed in order to extract two values which are then added in an accumulator (not shown) similar to the arrangement of FIG. 8. When the digit-reversed second six ternary digits are selected to address the ROM, the two phase lines must be complemented as before to select phase L−i instead of phase i. Also, a filter similar to the arrangement of FIG. 9 may be used alternately to obtain values corresponding to twelve I-chips and values corresponding to twelve Q-chips, when OQPSK or QPSK modulation is specified.

It has thus been explained how a relatively complex, 48-tap FIR filter with an impulse response duration of 12 QPSK symbols, an over-sampling factor of four, together with the implementation of up- and down-ramping for smoothly starting and stopping transmission may be built using a memory look-up table of 756 values. The invention has been exemplified by using the parameters of the IS-95 CDMA cellular standard, but can of course be adapted by a person skilled in the art to other applications without departing from the spirit and scope of the invention as defined by the following claims.

What is claimed is:

1. A method for generating spread spectrum modulated signals, comprising:
    receiving a number input samples representing a digital signal as successive bits at a specified rate;
    grouping the successive bits into at least a first sub-group of bits and a second sub-group of bits,
    alternately applying a selected one of the first sub-group of bits and the second sub-group of bits to a first set of address lines of a storage device that stores values corresponding to filter responses of the digital signal, wherein the storage device is addressable by a combination of the first set of address lines and a second set of different address lines for accessing a selected one of the stored values; and
    modifying a bit pattern applied to the second set of address lines, depending on whether the first sub-group of bits or the second sub-group of bits are applied to the first set of address lines.

2. The method of claim 1, wherein said modulation signals are generated at an output sample rate of more than one sample per symbol period, and wherein each of the more than one sample per symbol period is associated with a corresponding pattern of bits of the second set of address lines.

3. The method of claim 2, wherein the filter responses correspond to FIR responses to the input samples.

4. The method of claim 3, wherein the FIR responses exhibit time-reversal symmetry.

5. The method of claim 1, wherein the input samples comprise quadrature input samples including In-phase and Quadrature samples.

6. A digital filter for generating a spread spectrum modulated waveform, comprising:
    an input register that stores a number of successive bits representing an input signal at a specified bit rate, wherein said successive bits are grouped into at least a first sub-group of bits and a second sub-group of bits;
    a storage device that is addressable through a first set of address lines and a second set of address lines for accessing a selected memory location, wherein said storage device stores values that correspond to filter responses to the input signal;
    a multiplexer that selects between the first sub-group of bits and the second sub-group of bits to alternately apply a selected one of the first sub-group of bits and the second sub-group of bits to the first set of address lines;
    a counter that generates counter outputs at a clock rate that is a number of times higher than the specified bit rate; and
    an address modification circuit that modifies the counter outputs to generate the second set of address lines, wherein the second set of address lines is modified depending on whether the first or second sub-group of bits are applied to the first set of address lines.

7. The digital filter of claim 6 further including a summation device that adds together storage device outputs corresponding to alternately selected first and second sub-groups of bits to generate a sum output.

8. The digital filter of claim 6, wherein the filter responses correspond to FIR responses to the input samples.

9. The digital filter of claim 8, wherein the FIR responses exhibit time-reversal symmetry.

10. The method of claim 6, wherein the input signal comprise a quadrature input signal including In-phase and Quadrature components.

11. An improved signal generator for filtering a digital input signal and providing up-ramping and down-ramping for smooth commencement and termination of transmission, comprising:
    a ternary register for storing a successive number of a first and second set of binary bits that correspond to a ternary input signal representing the input samples, said first set of binary bits having a first binary state when an input sample is to be transmitted and a second binary state when an input sample is not to be transmitted, and said second set of binary bits having binary states corresponding to the polarity of an input sample to be transmitted;
    a storage device that stores values that correspond to filter responses to the input signal; and
    a line reduction logic circuit coupled to said ternary register, said line reduction logic limiting the number of possible combinations of the ternary register outputs to provide a reduced number of address lines for addressing the storage device.

12. The improved signal generator of claim 11, wherein the filter responses correspond to FIR responses to the input samples.

13. The improved signal generator of claim 12, wherein the FIR responses exhibit time-reversal symmetry.

14. The improved signal generator of claim 11, wherein the input samples comprise quadrature input samples including In-phase and Quadrature samples.

15. An improved signal generator for filtering a digital input signal and providing up-ramping and down-ramping for smooth commencement and termination of transmission, comprising:

a ternary register for storing a successive number of a first and second set of binary bits that correspond to a ternary input signals representing the input samples, said first set of binary bits having a first binary state when an input sample is to be transmitted and a second binary state when an input sample is not to be transmitted, and said second set of binary bits having binary states corresponding to the polarity of an input sample to be transmitted; and a storage device that stores values that correspond to filter responses to the input signal, wherein said storage device is addressed by ternary register outputs and stores a number of values that is less than the number of values that correspond to all possible combinations of the ternary register outputs.

16. The improved signal generator of claim 15, wherein the filter responses correspond to FIR responses to the input samples.

17. The improved signal generator of claim 16, wherein the FIR responses exhibit time-reversal symmetry.

18. The improved signal generator of claim 15, wherein the input samples comprise quadrature input samples including In-phase and Quadrature samples.

19. The improved signal generator of claim 15, wherein said storage device is an electronic memory from which storage locations corresponding to ternary register states that do not occur in operation of said signal generator are omitted to reduce the size of the storage device.

* * * * *